United States Patent [19]

Takaki et al.

[11] Patent Number: 5,534,808

[45] Date of Patent: Jul. 9, 1996

[54] SIGNAL DELAY METHOD, SIGNAL DELAY DEVICE AND CIRCUIT FOR USE IN THE APPARATUS

[75] Inventors: Kouichi Takaki, Hachioji; Mitsuo Azumai, Hino; Hiroshi Ishii, Kiyose, all of Japan

[73] Assignee: Konica Corporation, Tokyo, Japan

[21] Appl. No.: 8,715

[22] Filed: Jan. 25, 1993

[30] Foreign Application Priority Data

Jan. 31, 1992 [JP] Japan .................................. 4-016552

[51] Int. Cl.$^6$ ........................................................ H03K 5/13
[52] U.S. Cl. .......................... 327/261; 327/231; 327/235; 327/269; 327/276
[58] Field of Search ................................ 328/55, 63, 255; 307/269, 262, 602, 603; 327/141, 153, 154, 158–163, 231, 237, 238, 240–242, 250–253, 261–263, 269, 270, 276

[56] References Cited

U.S. PATENT DOCUMENTS

| | | | |
|---|---|---|---|
| 3,586,985 | 12/1969 | Schoendroff | 328/55 |
| 3,622,809 | 3/1969 | Williams | 328/55 |
| 3,911,368 | 10/1975 | Tarczy-Hornoch | 307/602 |
| 4,481,647 | 11/1984 | Gombert et al. | 328/55 |
| 4,618,788 | 10/1986 | Backes et al. | |
| 4,626,716 | 12/1986 | Miki | 327/270 |
| 4,675,612 | 6/1987 | Adams et al. | 328/63 |
| 4,700,347 | 10/1987 | Rettberg et al. | 328/55 |
| 4,713,621 | 12/1987 | Nakamura et al. | 328/155 |
| 4,796,095 | 1/1989 | Shimada | 328/63 |
| 4,797,586 | 1/1989 | Traa | 327/276 |
| 5,054,038 | 10/1991 | Hedberg | 328/155 |
| 5,073,730 | 12/1991 | Hoffman | 328/155 |
| 5,111,086 | 5/1992 | Back | 327/261 |
| 5,146,478 | 9/1992 | Dragotin | 327/250 |
| 5,245,231 | 9/1993 | Kocis et al. | 328/63 |

FOREIGN PATENT DOCUMENTS

| | | | |
|---|---|---|---|
| 3826717 | 2/1989 | Germany | 328/55 |
| 4104329 | 8/1991 | Germany . | |
| 0136262 | 10/1979 | Japan | 328/55 |
| 0189222 | 7/1989 | Japan | 328/55 |
| 0295518 | 11/1989 | Japan | 328/55 |
| 0184109 | 7/1990 | Japan | 328/55 |
| 4-42660 | 2/1992 | Japan . | |
| WO93/16528 | 8/1993 | WIPO . | |

OTHER PUBLICATIONS

IBM Technical Disclosure Bulletin vol. 18, No. 7 Dec. 1975.
IBM Technical Disclosure Bulletin vol. 31, No. 4, Sep. 1988.
European Search Report for European Patent Appln. No. 93101077.1 dated Dec. 6, 1994.
English language abstract of Japanese 4-42660(A).

Primary Examiner—Timothy P. Callahan
Assistant Examiner—T. Lam
Attorney, Agent, or Firm—Finnegan, Henderson, Farabow, Garrett & Dunner

[57] ABSTRACT

In a circuit provided in a single integrated circuit unit for use in a signal delay device, there is provided with a device in which an input signal is delayed and a plurality of delay signals, each having a different delay period from the input signal, are outputted, and a detector in which a delay signal having a specific relation with the input signal among the plurality of delay signals is detected.

3 Claims, 13 Drawing Sheets

3a-3n : OUTPUT SIGNAL DETERMINING UNIT

DL0 - DLn : DELAY SIGNAL

DL0D - DLnD : DUMMY SIGNAL

INPUT CLOCK

DL n

DL n+1

DL n+2

DL n+3

SL0 - SLn : SELECT SIGNAL FROM
SIGNAL DETECTING UNIT

DLh - DLg : DELAY SIGNAL FROM DELAY
ELEMENT GROUP

SIGNAL DELAY METHOD, SIGNAL DELAY DEVICE AND CIRCUIT FOR USE IN THE APPARATUS

BACKGROUND OF THE INVENTION

The present invention relates to a signal delay method, a signal delay device and a circuit for the signal delay device, and more particularly relates to a signal delay method, a signal delay device and a circuit for the signal delay device by which a highly accurate delaying operation can be carried out, giving consideration to the total delayed time regarding the entire signal path.

Conventionally, it is common to use a delaying line obtained on the market in order to provide an arbitrary delayed time. A distributed constant circuit such as a coaxial cable and a delaying cable is used for the aforementioned conventional delaying line, and also a lumped parameter circuit composed of a discrete L and C is used for the aforementioned conventional delaying line, so that an accurate delay signal can be provided.

However, this kind of delaying line is disadvantageous in that the cost is very high. In order to provide a desired delay signal at low cost, it has been proposed to use a plurality of delaying elements in an integrated circuit. However, the disadvantage of this method is that the delayed time is greatly affected by the fluctuation of various factors in the manufacturing process, and also affected by the temperature and humidity and the fluctuation of voltage of the power source in use. Therefore, it is impossible to provide a delay signal of predetermined accuracy.

SUMMARY OF THE INVENTION

The first object of the present invention is to provide a signal delay method by which a desired delay time can be accurately obtained in one integrated circuit. The second object of the present invention is to provide a signal delay device that can accurately control the delay time by a simple structure, further the signal delay device can be realized in one integrated circuit.

The third object of the present invention is to provide a signal delay device in which consideration is given to the total delay time with regard to the entire signal path. The fourth object of the present invention is to provide a signal delay device by which a highly accurate delay signal can be obtained even when an inputted signal has a poor duty ratio. The fifth object of the present invention is to provide a signal delay device in which the delay time can be finely adjusted, or can be selected by a manual operation with respect to a delay signal by a CPU disposed outside the signal delay device.

The first object of the present invention can be accomplished by a signal delay method, characterized in that: a delay signal is selected from a plurality of delay signals each having different delay time from each other which is obtained by delaying an input signal, wherein the selected delay signal has a specific relation with the input signal and the method is conducted in one integrated circuit.

The second object of the present invention can be accomplished by a signal delay device in the one integrated circuit, in which: a signal delay means delays an input signal and produces a plurality of delay signals each having different delay time from each other with respect to the input signal; and a signal selecting means selects a delay signal having a predetermined delay time with respect to the input signal, from the plurality of delay signals.

The third object of the present invention can be accomplished by a signal delay device including: a signal delay means that delays an input signal and produces a plurality of delay signals each having different delay time from each other with respect to the input signal; a signal detecting means that detects a delay signal having a specific relation with the input signal from the plurality of delay signals; and an output signal determining means that determines a delay signal to be outputted, in accordance with the result of the signal detecting means from the plurality of delay signals.

The fourth object of the present invention can be accomplished by a signal delay device including: a primary signal delay means that delays a primary input signal and produces a plurality of delay signals each having different delay time from each other with respect to the primary input signal; an auxiliary signal delay means that delays an auxiliary input signal different from the primary input signal and produces a plurality of delay signals each having different delay time from each other with respect to the auxiliary input signal; a signal detecting means that detects a delay signal having a specific phase relation with respect to the primary input signal from the plurality of delay signals outputted from the primary signal delay means; a primary output signal determining means that determines a delay signal to be outputted in accordance with the result of the signal detecting means from the plurality of delay signals outputted from the primary signal delay means; and an auxiliary delay output signal determining means that determines a delay signal to be outputted in accordance with the result of detection of the signal detecting means from the plurality of delay signals outputted from the auxiliary signal delay means.

The fifth object of the present invention can be accomplished by a signal delay device including: a signal delay means that delays an input signal and produces a plurality of delay signals each having different delay time from each other with respect to the input signal; a reference signal detecting means that detects a delay signal having a specific phase relation with the input signal from the plurality of delay signals; a correcting means that corrects the result of the signal detecting means; and an output signal determining means that determines a delay signal to be outputted, in accordance with the result of the correcting means from the plurality of delay signals.

In the signal delay device of the present invention, a delay signal having a specific relation with the input signal is detected by the signal detecting means from a plurality of delay signals outputted from the signal delay means, and according to the result of the signal detecting means, a delay signal to be outputted is selectively outputted by the output signal determining means.

DETAILED DESCRIPTION OF THE PREFERRED EMBODIMENTS

With reference to the attached drawings, an example of the present invention will be explained in detail as follows.

Figure 1:
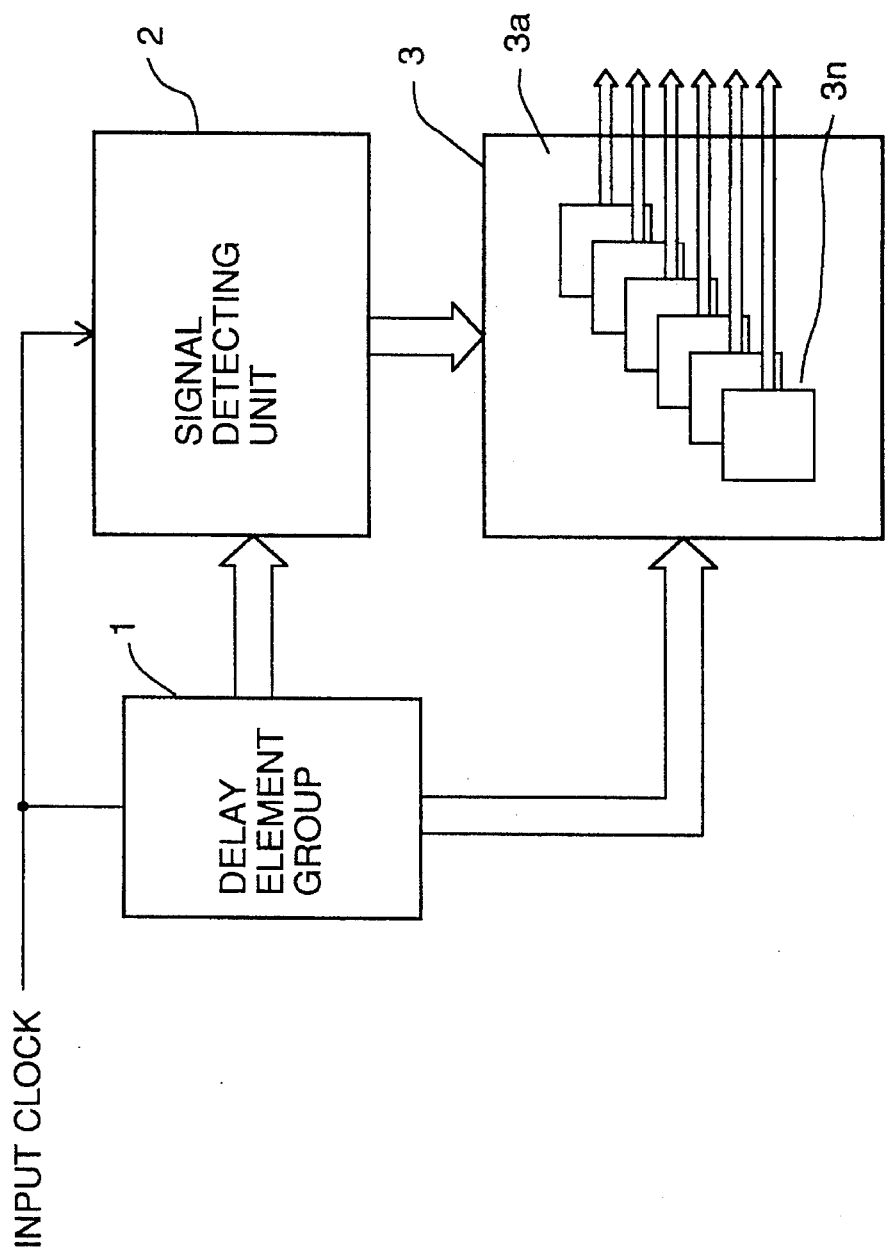
FIG. 1 is a schematic illustration showing the structure of the first example of the present invention.

FIG. 1 is a schematic illustration showing the entire structure of the first example of the present invention. In the drawing, numeral 1 is a group of delay elements composing the signal delay means of the present invention, and the delay elements are provided for obtaining a plurality of delay signals by delaying the input signal. Numeral 2 is a signal detecting section composing the signal detecting means of the present invention. Numeral 3 is an output signal determining group composing the output signal determining means of the present invention. The signal detecting section 2 and the output signal determining group 3 compose a signal selecting means that selects a delay signal having a predetermined delay time. Further, the output signal determining group 3 is composed of a plurality of output signal determining units 3a to 3n, which will be described later.

In order to obtain a highly accurate delay signal, the input signal inputted into the signal delay circuit of the present invention is preferably a clock signal having rectangular wave form whose duty ratio is 0.5. Therefore, the following examples will be explained on the assumption that the clock signal is used for the input signal.

Figure 2:
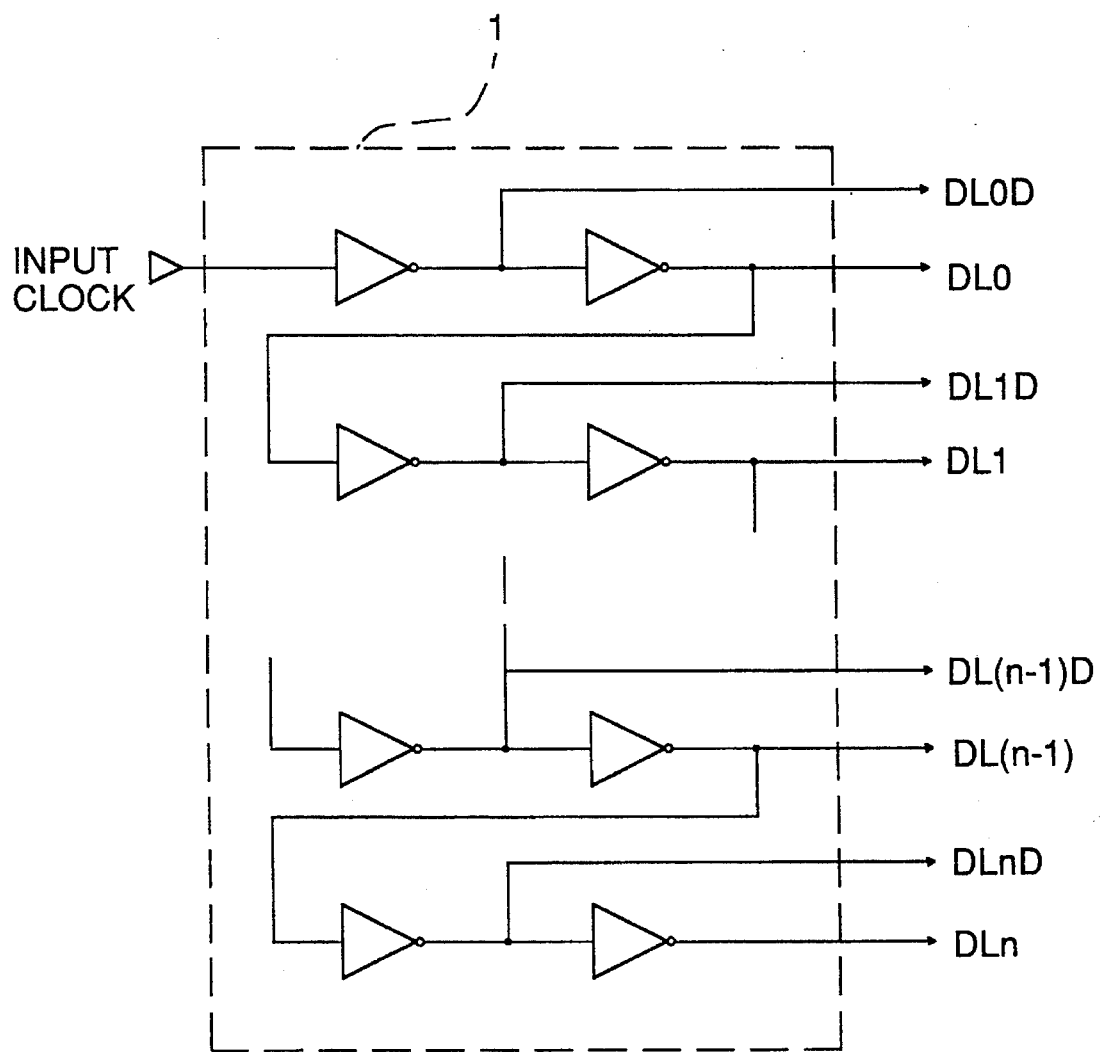
FIG. 2 is a schematic illustration showing the structure of the delay element group shown in FIG. 1.

FIG. 2 is a schematic illustration showing an example of the structure of the delay element group 1. In the example shown in FIG. 2, the inner cell (inverter) of an integrated circuit is used to form a delay element group having a plurality of circuit elements. In the aforementioned delay element group 1, two inverters are connected in each circuit element so that the duty ratio of a clock signal can be maintained until the last circuit element. The numbers of branches and the numbers of fan-outs are made equal so that the fluctuation of delay time can be minimized at each circuit element. Therefore, in the device shown in FIG. 2, $DL_0$ to $DL_n$ are delay signals substantially obtained in the delay element group 1. $DL_{OD}$ to $DL_{ND}$ are dummy signals in order to make the numbers of branches equal and also to make the numbers of fan-outs equal, are inputted into a dummy inverter so as to make the impedance equal to that of the delay signal path. The number of circuit elements of the delay element group is not particularly limited. However, there is a possibility that the delay time of each delay element is varied in a range from ⅓ to 3 times with respect to the typical value because of an environmental change such as a change in temperature. For that reason, it is necessary, to provide a sufficient number of stages to obtain a predetermined delay time so that the signal detecting means detects the signal, giving consideration to the change of delay time of each delay element. The signal delay means of the present invention is not limited to the aforementioned structure. For a plurality of delay signals having a different delay time from each other with respect to a clock signal to be produced, any structures can be used, for example, a counter can be used.

Figure 3:
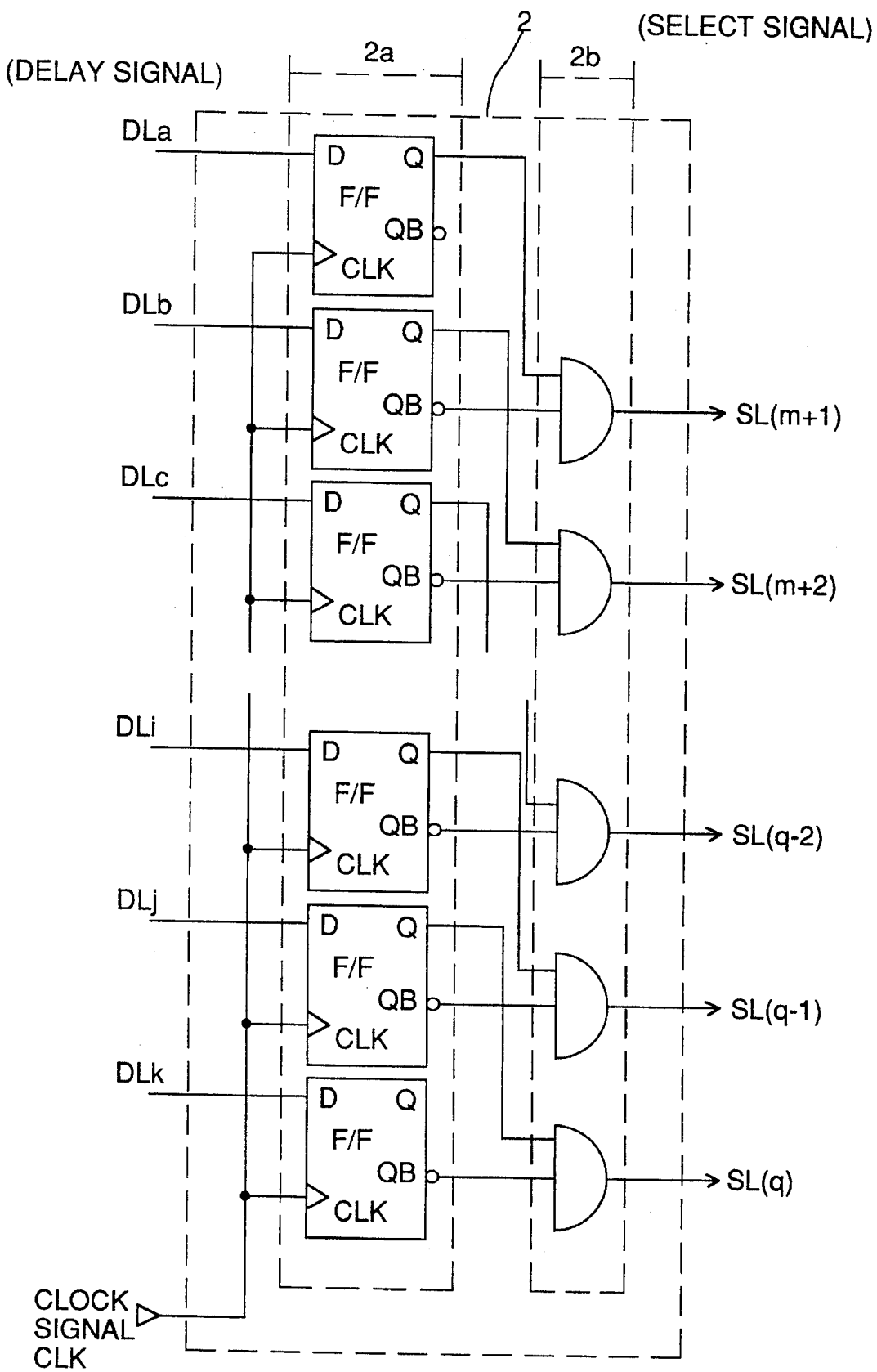
FIG. 3 is a schematic illustration showing the structure of the signal detecting unit shown in FIG. 1.

FIG. 3 is a schematic illustration showing an example of the structure of the signal detecting unit 2. This signal detecting unit 2 receives a plurality of delay signals from the delay element group 1, and also receives the input signal, so that a delay signal having a specific relation with the input signal is detected. In this case, the specific relation detected by the reference signal detecting unit is defined as a phase difference between the input signal and the delay signal. However, the present invention is not restricted by the relation described above. According to the present invention, consideration is given to factors in the input and output signals that are not substantially affected by external factors such as temperature. When some relations capable of being detected exist between the factors, the present invention can be realized. In the example of the invention, consideration is given to a wavelength that is not affected by temperature, and the detecting operation is carried out in accordance with the relation between the wavelength of the input signal and that of the delay signal, that is, the detecting operation is carried out in accordance with the difference between the phase of the input signal and that of the delay signal.

Especially when the input signal is a clock signal, it is preferable to detect the delay signal according to the phase of the input signal is the same as that of the delay signal (the phase difference corresponds to a period of time in which one period is multiplied by an integer). Alternately, it is equally preferable to detect the delay signal according to the phase of the input signal is reverse to that of the delay signal (the phase difference corresponds to a period of time in which half the period is multiplied by an odd number). Therefore, in this specification, that a delay signal is the same as or reverse to the input signal, is referred to hereinafter as a relation of synchronized phase. The following examples are structured in such a manner that a delay signal, the phase of which is reverse to the input signal, is detected.

In the example shown in the drawing, clock signal CLK is inputted into one end of each of a plurality of flip flops composing the flip flop group 2a, and delay signal DL sent from the delay element group 1 is inputted into the other end of each of the plurality of flip flops. An AND circuit is connected with a positive terminal of a flip flop, and the AND circuit is also connected with a negative terminal of a flip flop adjacent to the aforementioned one. Consequently the output signal of a flip flop has become "H" for the first time, so that only the output (select signal SL) of an AND circuit corresponding to the flip flop is "H". As far as the aforementioned select signal SL can be output, the circuit structure is not limited to the one shown in FIG. 3. For example, even when the flip flop is replaced with another one, or the logic of AND is inverted, the signal detecting section can be realized.

Figure 4:
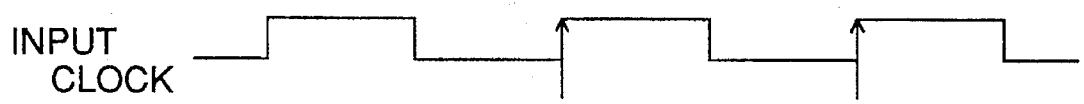
FIGS. 4(a) to 4(e) are time charts showing the timing of phase synchronization detection carried out in the signal detecting unit.
Figure 4:
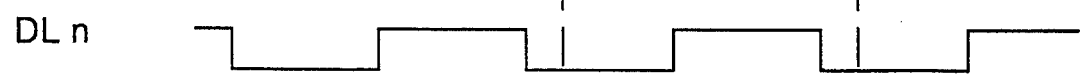
Figure 4:
Figure 4:
Figure 4:
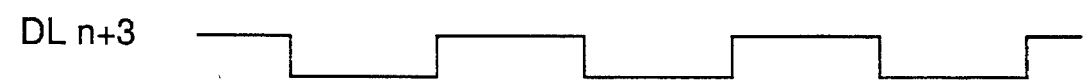

FIG. 4 is a time chart showing the fundamental timing of phase synchronization detection carried out in the reference signal detecting section 2. As an example, is shown a detecting operation of phase synchronization conducted between delay signals $DL_n$ to $DL_{n+3}$ outputted from the n-th to the (n+3)-th circuit elements of the delay element group 1, and the clock signal shown in FIG. 4(a). As can be seen in FIG. 4, the phase of delay signal $DL_{n+2}$ is synchronized with that of the clock signal.

Figure 5:
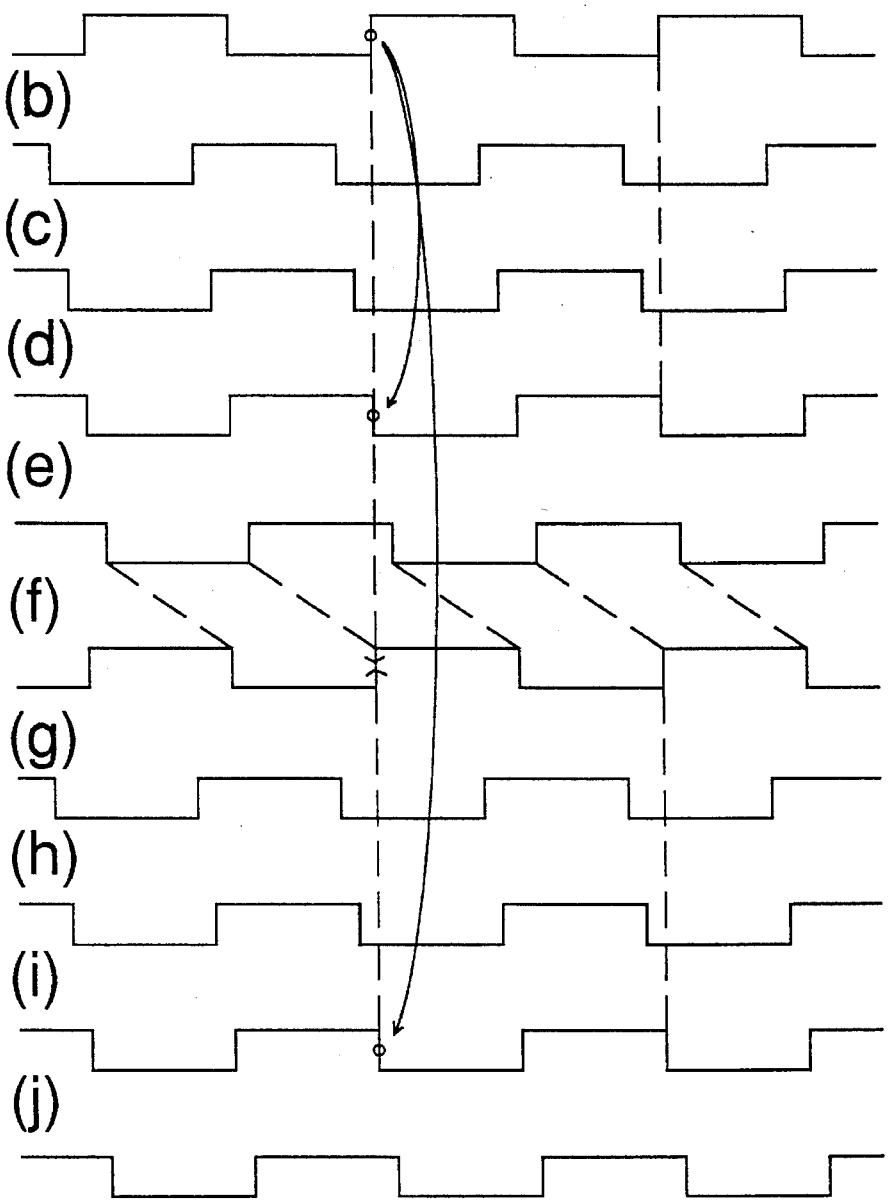
FIGS. 5(a) to 5(j) are time charts having a plurality of phase synchronizations.

Also, according to the number of circuit elements of the delay element group 1, there is a possibility that a plurality of signals of phase synchronization are detected as shown in the time chart of FIG. 5. That is, as shown in FIG. 5, the phase of the input clock is synchronized with $DL_{n+2}$, $DL_{n+m+3}$ and $DL_{n+m}$. However, it is sufficient that the detection of phase synchronization is conducted at one point. For that reason, in this example, the flip flop and the AND circuit are combined so that delay signal $DL_{n+m}$, the phase of which is the same as that of the clock signal, can not be detected. Delay signals $DL_{n+2}$ and $DL_{n+m+3}$, the phases of which are reverse to that of the clock signal, are preferably masked by the structure described later in order to prevent malfunction. Therefore, it is preferable that only one of them is detected.

Figure 6:
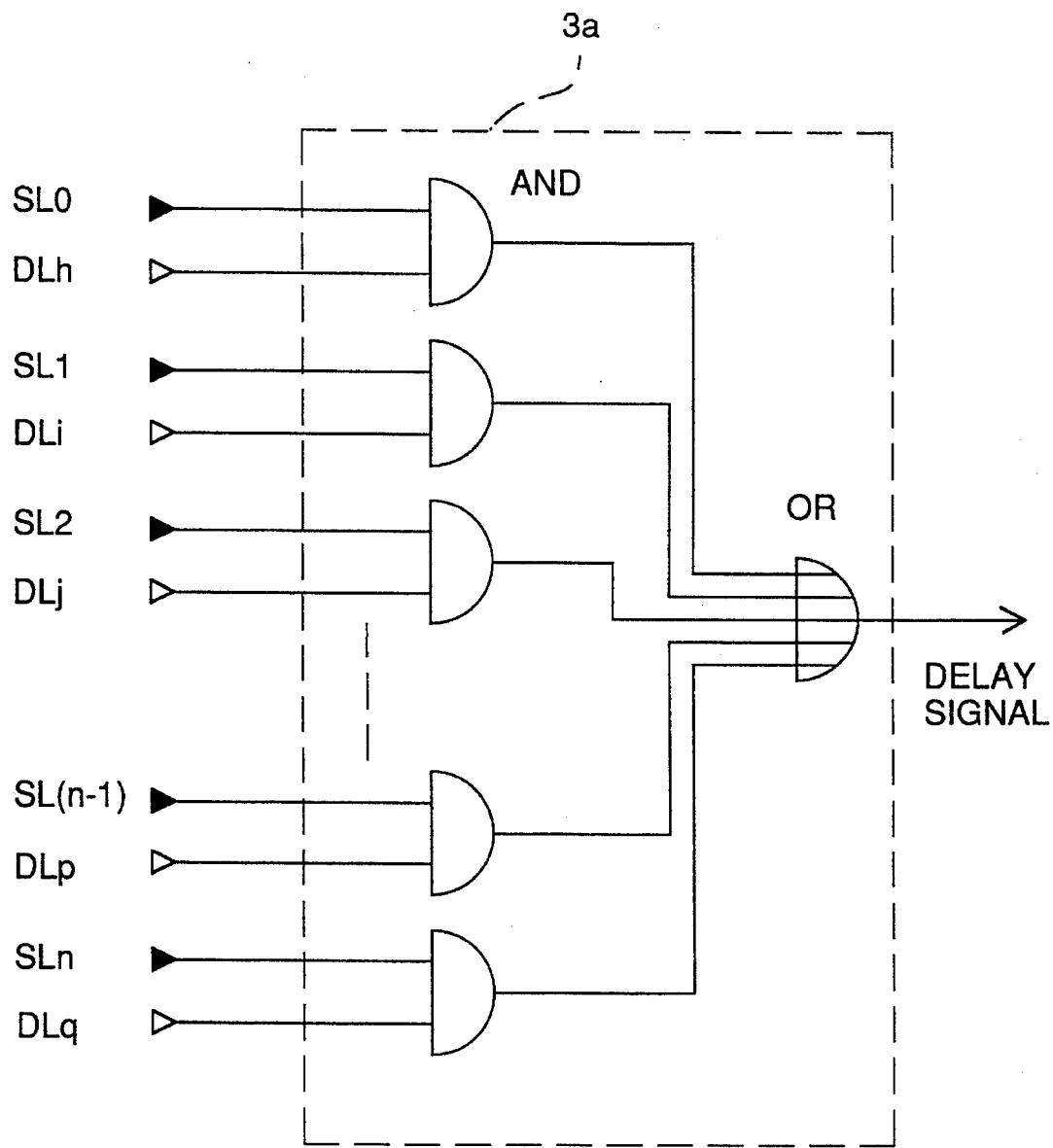
FIG. 6 is a schematic illustration showing the structure of an output signal determining unit shown in FIG. 1.

FIG. 6 is a view showing an example of the structure of the output signal determining section 3a illustrated in FIG. 1. This output signal determining section 3a outputs a delay signal corresponding to the result of detection carried out in the signal detecting unit 2, wherein the delay signal is previously allocated by the allocating expression described later, and this output signal determining section 3a is composed of a plurality of AND circuits. Therefore, delay signal DL having a desired delay time is outputted from an AND circuit which is connected with the signal detecting unit 2 having the detection result "H".

In the case where only one delay signal having a desired delay time is outputted, it is possible that the output signal determining means is composed of only the output signal determining section 3a. However, in the case where a plurality of outputs are required, a plurality of output signal determining sections 3b to 3n, the allocation of which has been changed, are connected with the delay element group 1 and the reference signal detecting section 2 in parallel. As a result of the foregoing, in one signal delay device, delay signals each having different delay time from each other can be outputted from each output signal determining unit. For example, three delay signals, the delay times of which are 10 ns, 20 ns and 30 ns, can be concurrently outputted.

In this example, the accuracy of the entire device is determined by the delay element group 1 and the reference signal detecting section 2. Especially, in the delay element group, the accuracy is determined by the property and the wiring of the inverter. Although the details are omitted in this specification, in order to improve the accuracy of delay time, the following points are important when the circuits are designed.

(1) Concerning the delay time of an inverter and the wiring of an inverter, the minimum one is selected.

(2) In order to reduce the fluctuation of delay, an inverter having large fan-out and a small delay wiring are used so that the fan-out of each inverter and the number of branches can become uniform.

(3) Positive logic and negative logic are combined so that the duty ratio of the input signal can not be collapsed.

(4) Unnecessary gates are avoided wherever possible.

(5) Regarding layout, delay element groups are made into a block for arrangement.

(6) The delay time at each circuit element is determined with reference to the typical value after arrangement.

It is possible to compose the device of the present invention having the aforementioned structure from digital circuits. Therefore, for example, the delay element group, the reference signal detecting unit and the output signal determining unit can be provided in one integrated circuit. Of course, only the delay element group and the signal detecting unit can be provided in one integrated circuit.

The operation of the circuit of this example having the aforementioned structure will be described as follows.

Delay is given to Clock signal CLK impressed from the outside, by a plurality of circuit elements of delay elements of the delay element group 1, and a plurality of delay signals DL having different delay times are generated. The aforementioned delay signals DL are supplied to one of the terminals of each flip flop of the flip flop group 2a of the reference signal detecting unit 2.

Clock signal CLK is supplied to the other terminal of each flip flop. When each flip flop detects the rising (or the falling) of clock signal CLK and that of delay signal DL, the delay signal DL is detected, the phase of which is synchronized with that of the clock signal. Only select signal SL sent from the AND circuit corresponding to the delay signal detected by the AND circuit group 2b, becomes a level of "H".

Select signal SL outputted from the reference signal detecting unit 2 in the aforementioned manner, is inputted into one AND circuit together with delay signal DL sent from the delay element group 1 according to the following equation.

$$A = (B/C) \times D - E/F \ldots \quad (1)$$

where A represents either the number of circuit elements which exist from a point where the input signal is inputted into on the delaying means where a delayed signal corresponding to the desired delayed signal is outputted, or a path length from a point where the input signal is inputted into a point on the delaying means where a delayed signal corresponding to the desired delayed signal is output; B represents a desired delayed time; C represents either one period of the input signal when the detecting means detects a delayed signal having the same phase as that of the input signal, or a half period of the input signal when the detecting means detects a delayed signal having phase reverse to that of the input signal; D represents either the number of circuit elements which exist from a point where the input signal is input into a point on said delaying means where a delayed signal corresponding to the detected signal is obtained, or a path length from a point where the input signal is inputted into a point on the delaying means where a delayed signal corresponding to the detected signal is obtained; E represents a delayed time which is obtained by subtracting a delay time required for a passage of the input signal through the delaying means from entire delayed time required for a passage of the input signal through a signal path from a point where the input signal is inputted into a point where the delayed signal is outputted; and F represents a standard delay time required for a passage of the input signal through unit circuit elements or unit path length.

As far as the present example is concerned, the aforementioned equation (1) is equivalent to the following equation (2).

$$G = (H/I) \times J - K/L \ldots \quad (2)$$

where

G: Stage in a delay element group from which a delay signal is taken out

H: Desired delay time (ns)

I: A half period of a clock signal

J: Stage of a select signal

K: Total delay time (ns) necessary for a clock signal to pass through a path except for a delay element group, from a point where the clock signal is inputted, to a point where a delay signal having desired delay time H is outputted L: Standard delay time (ns) for a clock signal to pass through delay elements of a unit number (corresponding to two inverters)

That is, according to the result of detection carried out in the reference signal detecting unit 2, a delay signal to be outputted can be found from the aforementioned equations (1) and (2).

For example, when I: 100 ns, J: 100-th circuit element, K: 5 ns, and L: 1 ns, and when it is desired to obtain a delay signal, the delay time of which is 10 ns, G=5 can be found from equation (2). That is, AND circuit corresponding to the select signal of 100-th circuit element (that is, the AND circuit of the 100-th circuit element in the delay signal output determining section 3a) is connected with a delay signal outputted from the delay element of the fifth circuit element of the delay element group 1. In the case where the solution of equation (2) is not an integer, the number is rounded at the first decimal place, or the fractions of the first decimal place are ignored so that an integer can be obtained.

There are various methods for allocating the select signals and delay signals. Therefore, the most appropriate method should be selected in accordance with the required accuracy of delay time.

As a result of the aforementioned allocation, a desired delay signal is outputted from the output signal determining section 3a. That is, even when a delay time of the delay signal sent from the delay element group 1 is fluctuated due to the fluctuation of voltage and temperature, the reference signal detecting section 2 always conducts a detecting operation of phase synchronization. Therefore, after one clock has passed after the detection timing of phase synchronization, a new selecting signal is outputted from the output signal determining section 3a in accordance with a new select signal, so that the delay signal can be corrected approximately in real time.

The obtained delay signal is outputted, for example, into a PWM circuit described later. In order to stop outputting a delay signal in the case where the PWM circuit does not require the delay signal, a control section to control whether a delay signal is outputted or not, may be provided after (or inside) the output signal determining group 3.

In the case where a sufficient nurser of circuit elements of the delay element group 1 are not provided, there is a possibility that a delay signal, the phase of which is synchronized with a clock signal, is not detected at the signal detecting section 2. In this case, the delay signal output from the last stage of the delay element group 1 should have a delay time closest to a desired value. In the case where select signal SL is not inputted into the output signal determining group 3, the delay signal outputted from the last circuit element of the delay element group 1 may be outputted.

Instead of the aforementioned output signal determining group 3, a CPU provided outside the signal delay device may be used for the output signal determining means. That is, when the delay element group 1 and the signal detecting unit 2 are connected with the CPU provided outside the circuit so that they are controlled by appropriate software, the allocation of the aforementioned equation (1) or (2) can be sequentially calculated, and a delay signal having a desired delay time can be outputted.

Next, the structure to prevent malfunction in the following case will be explained: since the number of circuit elements of the delay element group 1 is large, the output of the delay element group 1 contains a plurality of delay signals, for example delay signals $DL_{n+2}$ and $DL_{n+m+3}$ shown in FIG. 5 that have been delayed by not less than one clock, and as a result, a plurality of signals of phase synchronization are detected in the signal detecting means.

Figure 7:
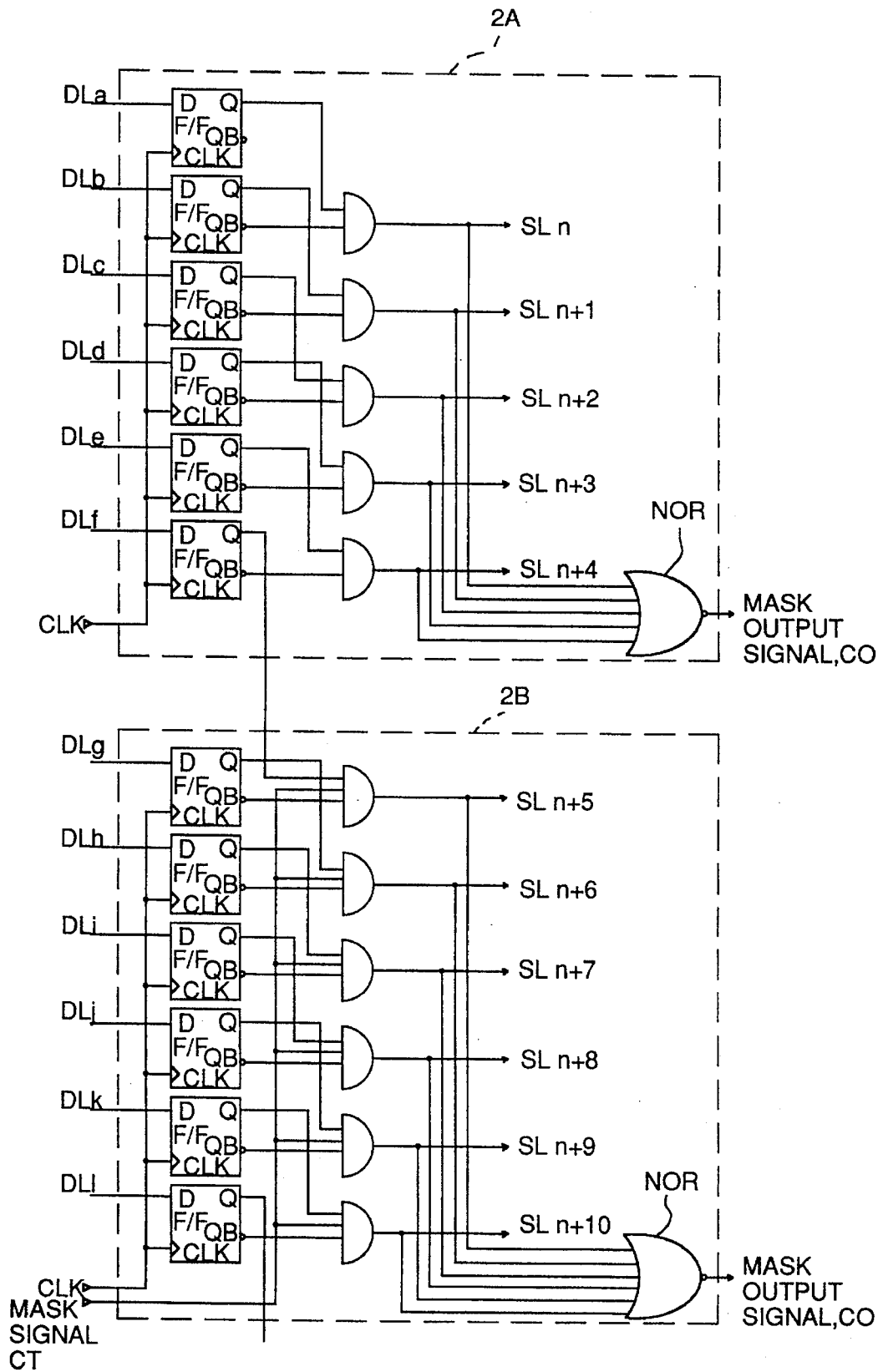
FIG. 7 is a schematic illustration showing the structure of the signal detecting unit for masking.

In this case, the signal detecting means is preferably composed as follows: the signal detecting blocks 2A to 2D shown in FIG. 7 are structured in the manner shown in FIG. 8. The structure of these signal detecting blocks will be explained below.

First, in the signal detecting block 2A, clock signal CLK is inputted into one end of each flip flop, the number of which is predetermined, and delay signal DL is inputted into the other end from the delay element group 1. Then, the positive terminal of a flip flop is connected with 2-input AND circuit that is connected with the negative terminal of an adjacent flip flop. Further, the output of the aforementioned 2-input AND circuit is inputted into the delay signal output determining group 3, and at the same time, inputted into negative OR (NOR) so that a mask output signal CO is outputted.

On the other hand, in the signal detecting blocks 2B to 2D, clock signal CLK is inputted into one end of each of the flip flops, the number of which is predetermined, and delay signal DL is inputted into the other end from the delay element group 1. Then, the 3-input AND circuit is connected to receive the positive terminal of a flip flop, the negative terminal of an adjacent flip flop, and mask signal CT. Further, the output of the 3-input AND circuit is inputted into the output signal determining group 3 as select signal SL, and at the same time the output is subjected to negative OR, and the result is outputted as mask output signal CO.

Figure 8:
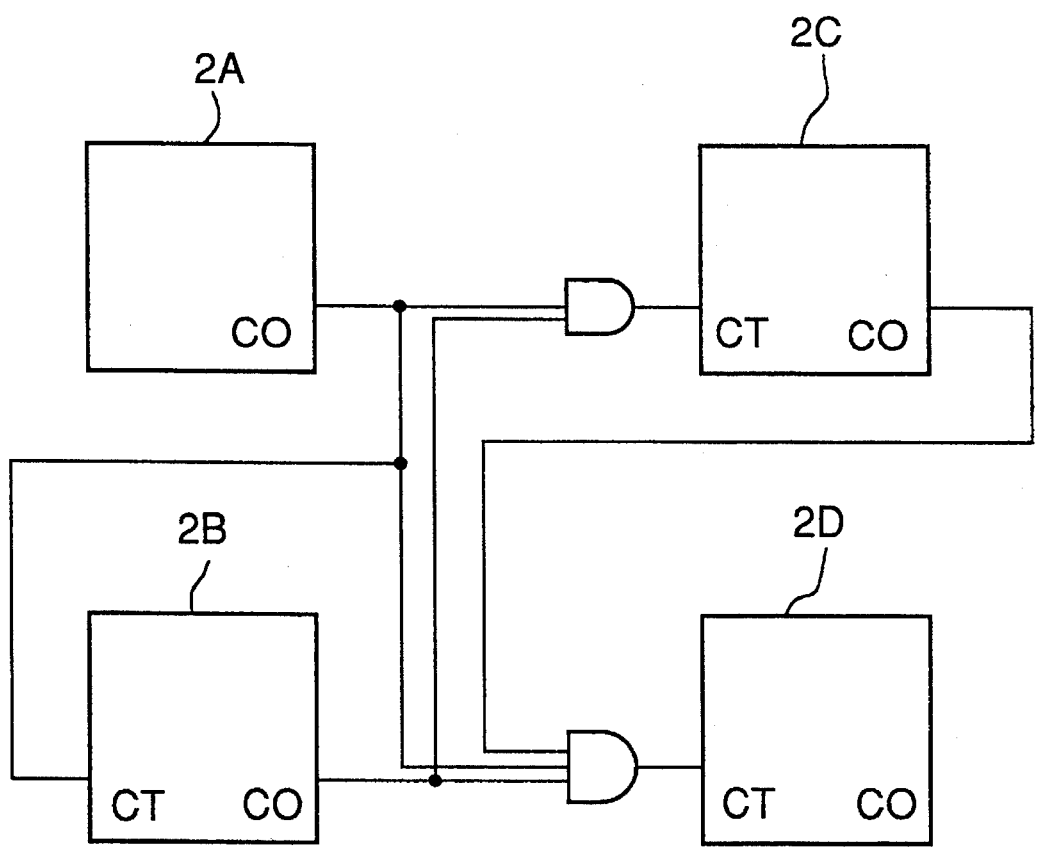
FIG. 8 is a schematic illustration showing the first example of the structure of the signal detecting block.

As shown in FIG. 8, in the reference signal detecting blocks 2A to 2D, mask output signal CO of the reference signal detecting block 2A, and mask output signal CO of each of the signal detecting block 2B to 2D are connected with an AND circuit, and the output of the AND circuit is inputted to the following stages.

According to the aforementioned structure, only in one block among the signal detecting blocks 2A to 2D, where the phase has been synchronized for the first time, does the select signal become "H". In other blocks, the input of mask signal CT is "L", so that phase synchronization is not detected. Consequently, when the number of circuit elements of the delay element group 1 is large so that the detection range of the signal detecting means is extended, problems are hardly caused even when the device is located in an environment where the fluctuation of voltage and temperature is extremely large. In the example shown in FIG. 8, a 4 stages block structure is adopted, however, the present invention is not limited to the specific embodiment. It is possible to adopt the following mask processing method which is different from the one described above: the AND circuit in the signal detecting block 2A is replaced with a 3-input AND circuit in the same manner as the aforementioned signal detecting blocks 2B to 2D; and the mask processing is conducted by a mask signal sent from a CPU as shown in FIG. 9.

Figure 9:
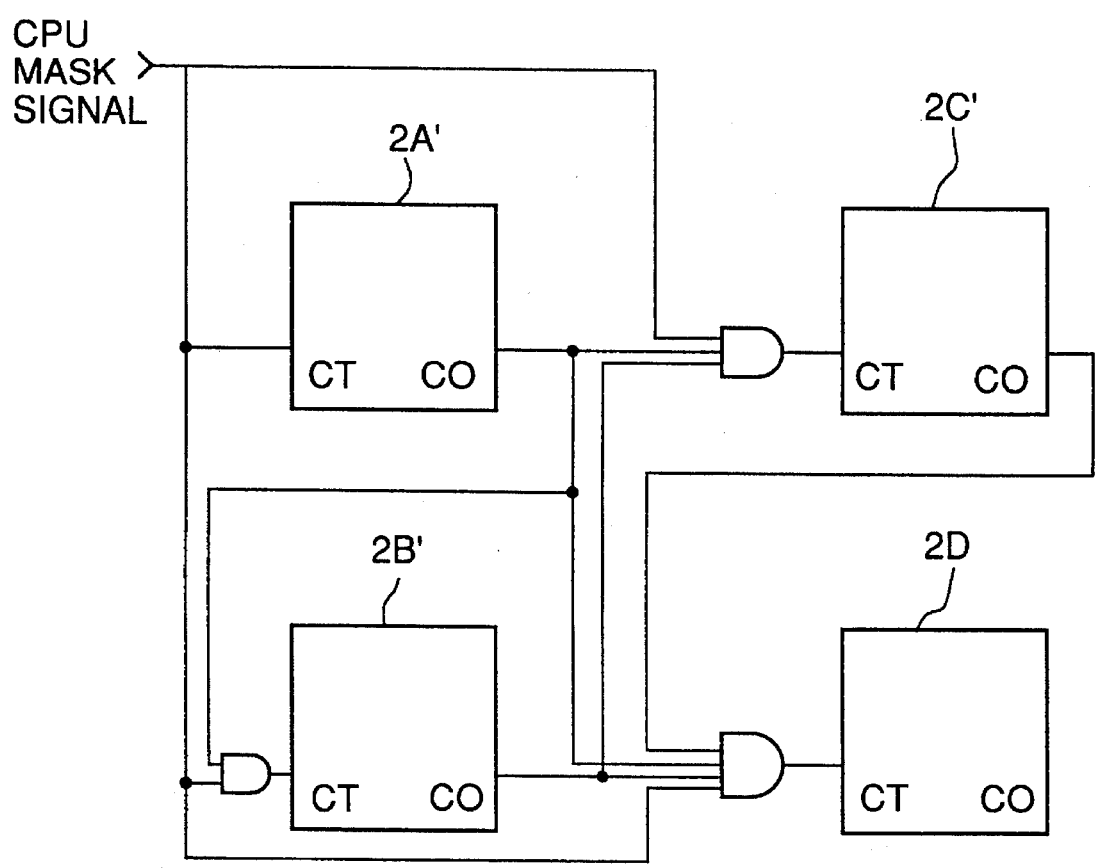
FIG. 9 is a schematic illustration showing the second example of the structure of the signal detecting block.

An abnormal condition in which a plurality of detection results are obtained in the signal detecting section 2, can usually be removed by the circuit structure shown in FIGS. 7 to 9. However, in the case where the circuit of masking portion is out of order, or the internal element of the reference signal detecting section 2 is damaged, or an operation is conducted exceeding the guaranteed range, it is impossible to avoid malfunction by the circuits shown in FIGS. 7 to 9. In this case, the following abnormal conditions occur: the delay signal sent from the output signal determining group 3 becomes inaccurate; or the delay signal is not provided. In order to avoid the aforementioned abnormal conditions, it is effective to provide the correcting means shown in FIG. 10.

Figure 10:
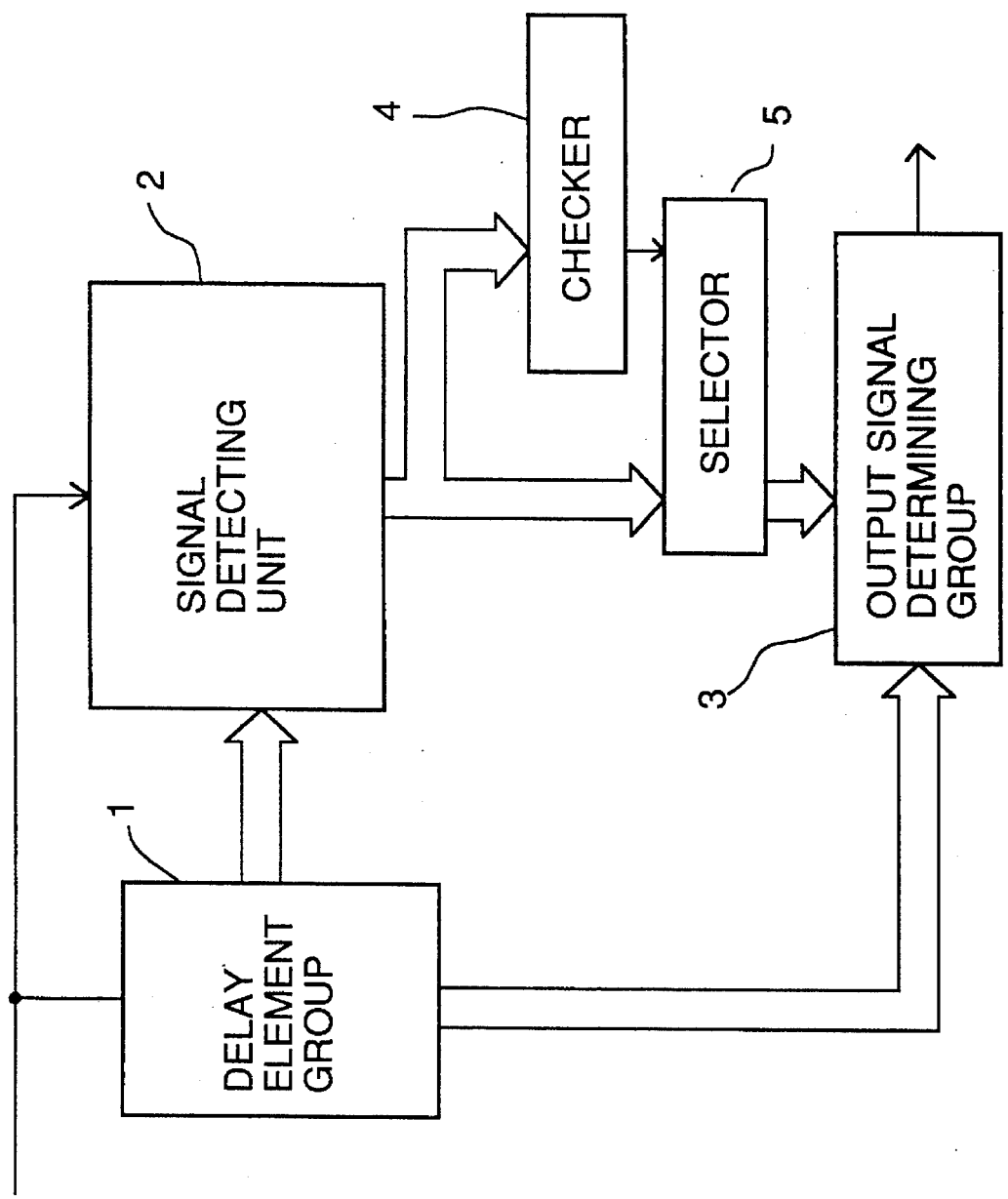
FIG. 10 is a schematic illustration showing the structure of the second example of the present invention.

That is, in FIG. 10, the following structure is shown: a monitoring section 4 including a cPu provided outside of the circuit monitors the state of select signal SL sent from the reference signal detecting section 2; and in the selector section 5, a predetermined select signal is selected according to the result of monitoring conducted by the monitoring section 4; and after the select signal has been masked, or written down, the signal is outputted to the output signal determining group 3.

For example, when a plurality of look-up tables are provided in the monitoring section 4, the select signal can be monitored so as to find the occurrence of an abnormal condition. In the case of an abnormal condition, the following control operations are carried out.

In the case of an abnormal condition in which a plurality of select signals have been selected, the monitoring section 4 commands the selector section 5 to mask the select signals except for the select signal that appeared first. In the case of an abnormal condition in which the select signal is not outputted from the signal detecting section 2, a command signal to generate a predetermined select signal is outputted to the selector section 5. (For example, the aforementioned predetermined select signal is a select signal outputted from the last stage of the signal detecting section 2.) It is also possible to structure in the following manner: when the reference signal detecting section 2 is out of order, the reference signal detecting section 2 is completely neglected, and an arbitrary select signal is written down from the monitoring section 4.

The monitoring section 4 is effective not only in the case of an abnormal condition but also in the case of manual operation by which a delay signal is obtained. That is, in the case where a desired delay time is required that has not been allocated by the output signal determining group 3, even when only the delay signals of 10 ns and 20 ns have been allocated as a desired delay time, a select signal corresponding to a delay signal having a delay time of 15 ns can be calculated and selected in accordance with the aforementioned allocation equation (1) from a select signal inputted into the monitoring section 4.

Figure 11:
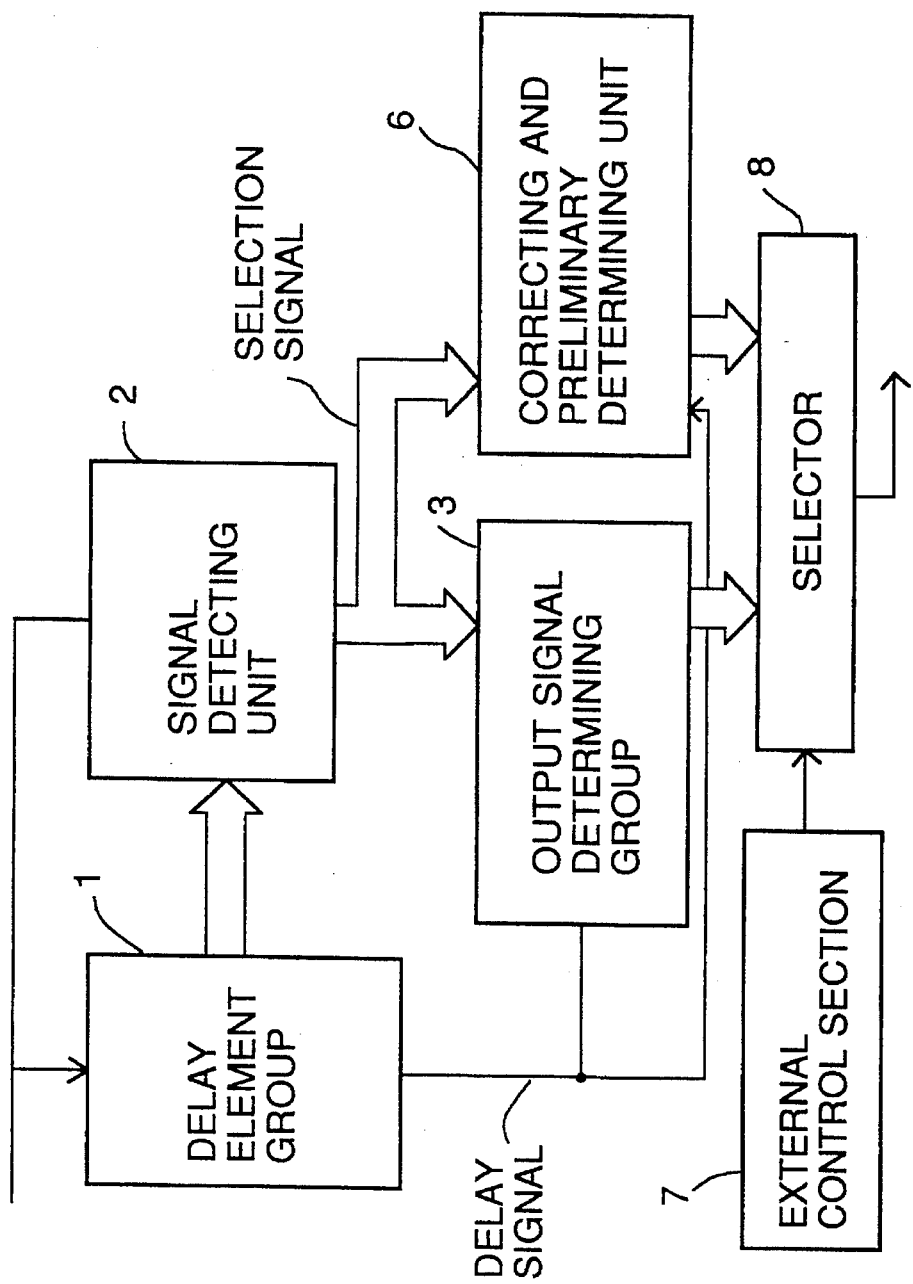
FIG. 11 is a schematic illustration showing the structure of the third example of the present invention.

FIG. 11 is a schematic illustration showing the structure of another example of monitoring a select signal. In the structure shown in the drawing, the external programable combination section 6 that can rewrite the detection result of the signal detecting section 2, monitor the state of a select signal. In the case where an abnormal condition has occurred in a select signal, instead of the delay signal selecting a section group, the external programable combination section 6 outputs a delay signal. That is, this external programable combination section 6 is structured as a preliminary output signal determining means provided in parallel with the output signal determining group. That is, this external programable combination section 6 has a plurality of delay signal combination patterns concerning the abnormal condition of a select signal. In accordance with a delay signal combination corresponding to a pattern, the external programable combination section 6 outputs a delay signal. One of the outputs of the output signal determining group 3 and the output of the external programable combination section 6, are taken outside by the selector 8 controlled by the external control section 7. This selector 8 can be operated in the following manner: one of the signals is outputted; a plurality of signals are concurrently outputted; and the selector 8 is operated programably in accordance with the command of the external control section 7.

Figure 12:
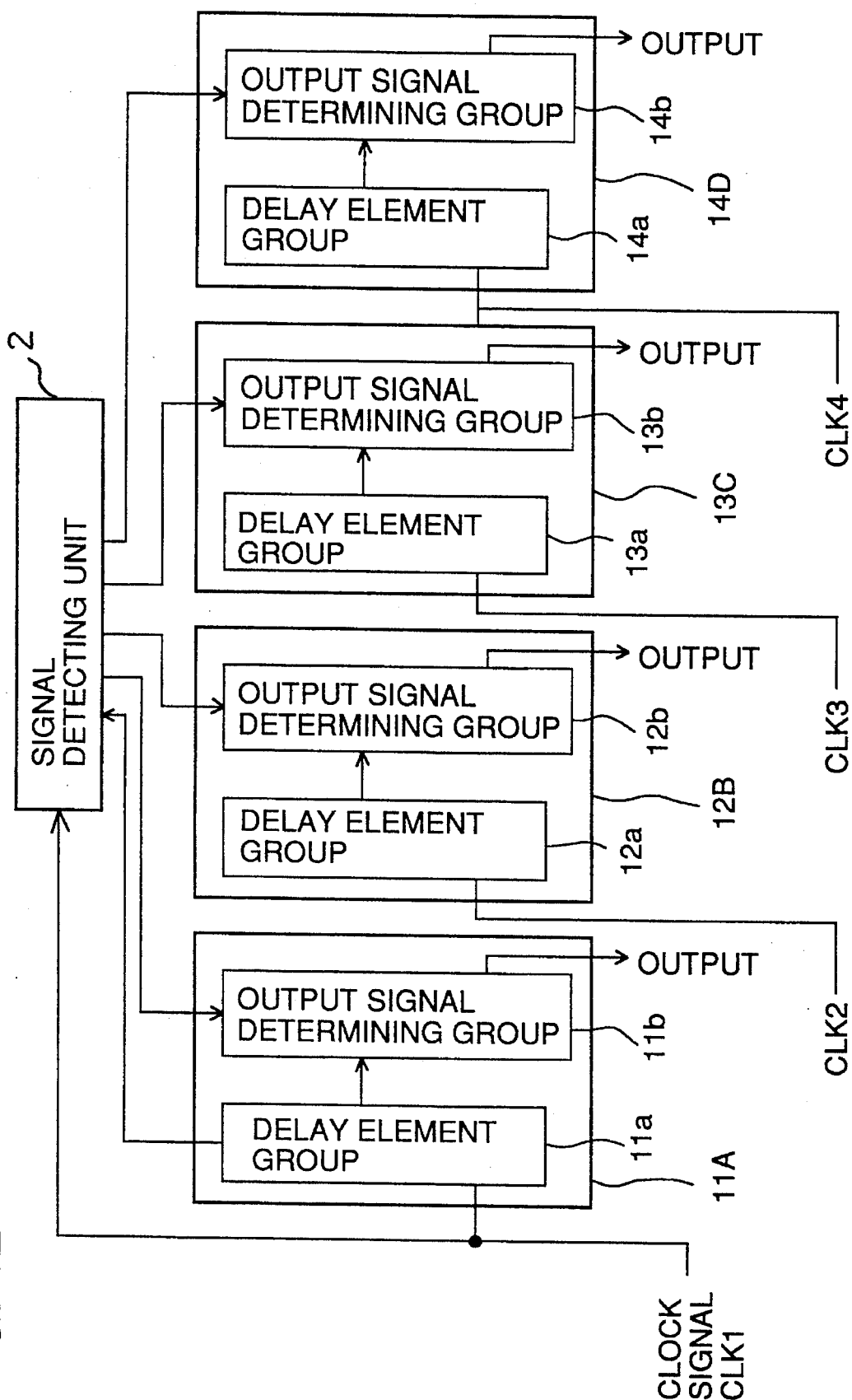
FIG. 12 is a schematic illustration showing the structure of the fourth example of the present invention.

The signal delay device of the present invention may be formed into a network structure as shown in FIG. 12. In the drawing, delay lines 11A to 14D are composed of the delay element groups 11a to 14a and the output signal determining groups 11b to 14b that are structured in the same manner as the delay element group 1 and the output signal determining group 3 respectively shown in FIGS. 2 and 6. In accordance with the clock signal inputted into delay element group 11a, the phase synchronization is detected in the signal detecting section 2'. The results of the detection are inputted into the output signal determining group 11b to 14b, and a delay signal having a desired delay time is outputted from the delay element group at each output signal determining group in accordance with the detection result.

The aforementioned network structure is effective in the case where the duty ratio of an inputted clock signal is collapsed. That is, when the wave form of a clock signal having the purest in such a manner that the duty ratio is 0.5, or when a pure clock signal sent from an oscillator provided outside is inputted into the signal detecting section 2' as clock signal CLK1, correct detection results can be obtained in the reference signal detecting section 2' even when the duty of the clock signals (CLK2 to CLK4) inputted into other delay lines (B to D) is collapsed. Since the network structure is adopted, only the clock signal inputted into the signal detecting section 2' is made pure so that the reference signal detection can be accurately conducted. Even when the duty ratio of clock signal CLK1 is not 0.5, it can be used as an accurate clock signal when a dividing operation is conducted. Since only one signal detecting section 2' is used, the number of gates can be greatly reduced, so that the circuit structure can be simplified, and further the reliability of signal delay device is improved and the production cost of signal delay device can be reduced.

Figure 13:
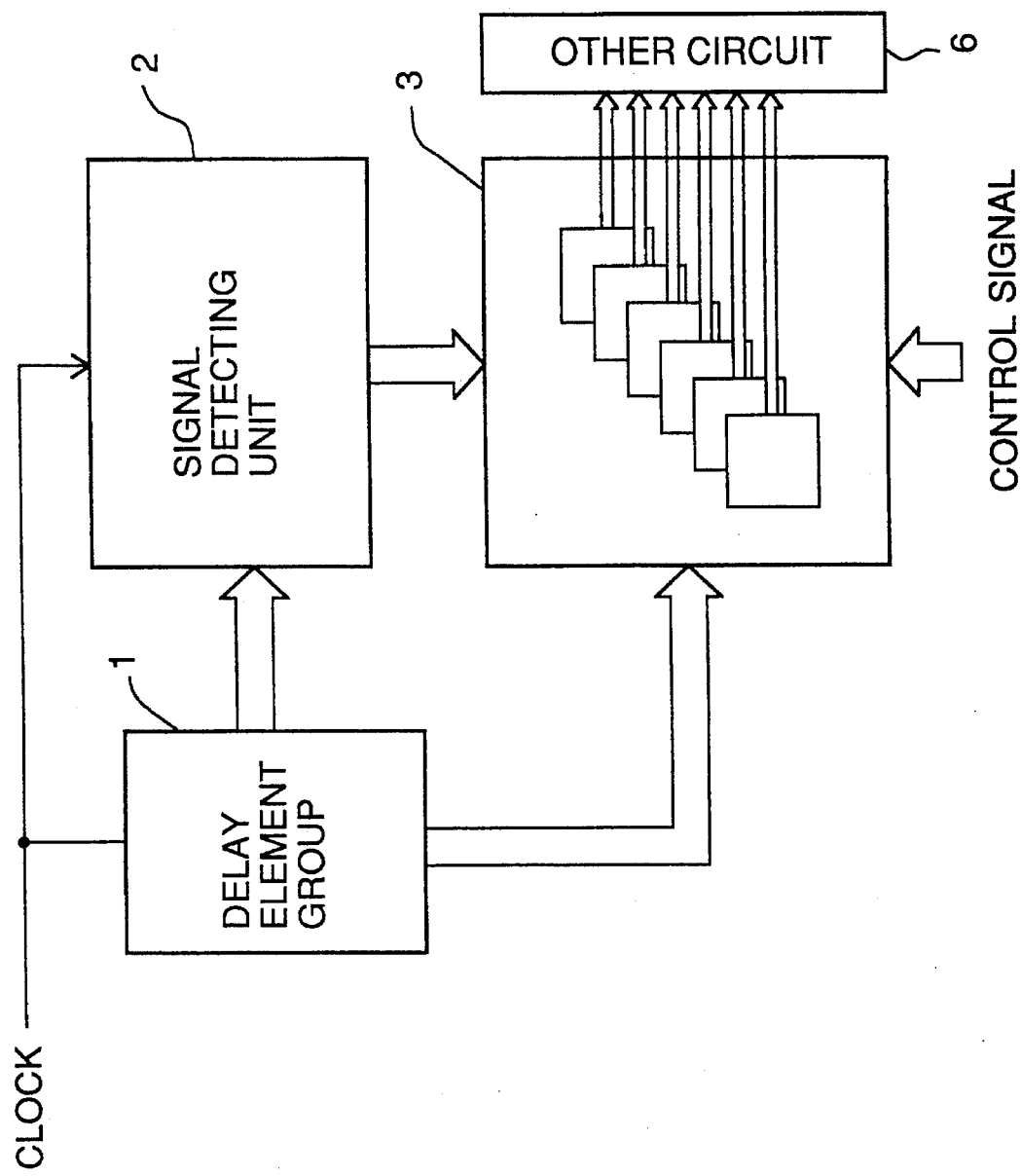
FIG. 13 is a schematic illustration showing the structure of the fifth example of the present invention.

FIG. 13 shows another example of the present invention. The aforementioned signal delay device of the invention is composed of an integrated circuit including gate arrays, and digital processing can be conducted in the circuit. Therefore, programable processing can be conducted, for example, the signal delay circuit can be combined with a circuit having another function, or the operation of the signal delay circuit is changed by rewriting the data in accordance with software inputted from the outside of the circuit. For example, the following are specific examples of the combination of the signal delay circuit with a circuit having another function.

(1) The combination of the signal delay device with a pulse width modulating circuit (2) The combination of the signal delay device with Synchronization circuit These circuits are connected to the latter stage of the output signal determining group 3 as a circuit having another function.

A case in which a pulse width modulating circuit is used for another functional circuit is taken for an example. Conventionally, a large number of delay signals necessary for generating a pulse width modulating signal are supplied from the outside of the delay signal circuit. Therefore, the following problems are caused: the noise generated for the delay signal circuit affects the units disposed outside of the circuit; and the time width of a pulse width modulating output signal is restricted by the number of connections of the delay line. However, when the pulse width modulating modulation circuit is composed together with the present signal delay device as shown in FIG. 12, not only the installation space can be reduced but also the radiation of generated noise can be greatly reduced. Further, when a control signal (select signal) is written from a CPU provided outside of the delay signal circuit, the amount of delay among connections can be easily changed, so that the time width of the PWM output signal can be finely :adjusted. Furthermore, when the change of the operation is necessary the stored data is rewritten using software, so that the change of the operation can be carried out.

Next, a case is studied in which the synchronization circuit and signal delay device are combined. In order to improve the accuracy of a dot clock, it is conventionally necessary to increase the number of connections of a delay line. However, the conventional delay line is so expensive that the cost must be raised to improve the accuracy. However, in the case of the signal delay device of the present invention, the number of output delay signal can be easily increased only when the number of the delay signal selecting sections is increased. Accordingly, the accuracy of the dot clock can be improved at low cost. Further, it is possible to combine the signal delay device of the invention with the synchronization circuit disclosed in the official gazette of Japanese Patent Application Open to Public Inspection No. 42660/1992 applied previously to this application. Thereby, the problem of noise radiation can be solved. Furthermore, when the signal delay device of the invention is applied to the aforementioned external programable circuit 6, it becomes possible to change the operation by rewriting the data in accordance with the software provided outside of the device.

As explained above, the signal delay device of the invention can be provided on one integrated circuit together with other circuits having different functions. Therefore, the signal delay device of the invention can be applied to an image forming device such as a laser beam printer, copier or facsimile when data is synchronously sent out in the device. Further, the signal delay device of the invention can be used for making the timing of the following three signals in the operation of DRAM: an RAS signal to determine a line address, a CAS signal to determine a row address, and an R/C signal to change over between the RAS and CAS signals. Further, the signal delay device of the invention can be applied to the generation of a reset pulse of the CCD signal. Furthermore, the signal delay device of the invention can be applied in the following manner: it can be applied to a multiphase clock circuit so as to conduct high speed processing; it can be applied to a clock phase synchronization circuit so as to make an outside clock coincide with an inside clock; and it can be used with a synchronization signal generating circuit so as to generate a clock synchronized with outside data. In this way, the signal delay device of the invention can be applied in a same manner as a conventional signal delay line.

As explained in detail, according to the present invention, a delay signal, the phase of which is synchronized with that of a clock signal, is detected from a plurality of delay signals sent from the signal delay means by the signal detecting means, and according to the result of the signal detecting means, a required delay signal is selected from the delay signals of the signal delay means by the output signal determining means. Consequently, the delay time can be highly accurately controlled by a simple structure, and at the same time, consideration can be given to the total delay time with regard to the entire signal path.

After one clock has passed from the timing in which reference signal detection was carried out, a delay signal is selected. Therefore, even when the delay time fluctuates, a delay signal, the delay time of which is accurate, can be provided in real time.

Even when a plurality of signal detecting outputs are generated, all signals except for a predetermined one are masked, so that there is no possibility of malfunction.

Since the monitor means to monitor the signal detection output is provided, an abnormal signal detecting output caused by abnormal delay time can be removed. Accordingly, even when the delay time given by the signal delay means is not in an allowable range, a desired delay time can be provided.

Furthermore, even when a plurality of signal delay means and output signal determining means are provided, a clock signal having the purest wave form as a clock signal inputting in the signal detecting unit can be selected by employing a network structure in which signal detection is conducted by one signal detection means. Consequently,, even when the duty of a clock inputting into other delay lines is collapsed, information of accurate reference signal detection can be obtained.

When only one signal detecting section is used, the number of gates can be greatly reduced, so that the circuit structure can be simplified, and reliability of the signal delay device can be improved and the production cost of the delay signal device can be reduced.

Further, all the circuits are producted as digital circuits, so that the cost of the delay line of the invention can be reduced to about ¼ of that of a conventional delay line, and further it is easy to expand the device. Furthermore, when the signal delay device can be composed of one chip on the integrated circuit, for example the gate array, the interference between the signals outputted from the external delay lines that tends to occur in the external delay lines is not caused, and the problem of signal noise can be solved.

What is claimed is:

1. A device for providing a desired delayed signal, comprising:
   (a) means for delaying an input signal to produce a plurality of delayed signals, each delayed signal having a different delay time with respect to said input signal;
   (b) a plurality of phase detecting means for detecting a plurality of specific delayed signals having specific relations with said input signal from said plurality of delayed signals;
   (c) masking means for making only one of said plurality of phase detecting means operative; and
   (d) means for determining a desired delayed signal from said plurality of delayed signals according to the detected result by said plurality of detecting means to output said desired delayed signal.

2. The device of claim 1, wherein said one of said phase detecting means detects the specific delayed signal having a shortest delay time.

3. The device of claim 2, wherein said plurality of phase detecting means are divided into a plurality of groups, one of said plurality of specific delayed signals is detected in each of said groups, and said masking means output signals for inhibiting said specific delayed signal from being detected in other groups when said specific delayed signal is detected in one of said groups.

* * * * *